United States Patent
Amundson et al.

(10) Patent No.: US 8,373,211 B2
(45) Date of Patent: Feb. 12, 2013

(54) FIELD EFFECT TRANSISTOR

(75) Inventors: Karl R. Amundson, Cambridge, MA (US); Andrew P. Ritenour, Colfax, NC (US); Gregg M. Duthaler, Needham, MA (US); Paul S. Drzaic, Morgan, CA (US); Yu Chen, Milpitas, CA (US); Peter T. Kazlas, Sudbury, MA (US)

(73) Assignee: E Ink Corporation, Cambridge, MA (US)

( * ) Notice: Subject to any disclaimer, the term of this patent is extended or adjusted under 35 U.S.C. 154(b) by 0 days.

(21) Appl. No.: 13/089,404

(22) Filed: Apr. 19, 2011

(65) Prior Publication Data

US 2011/0194045 A1  Aug. 11, 2011

Related U.S. Application Data

(60) Division of application No. 12/552,334, filed on Sep. 2, 2009, now abandoned, which is a division of application No. 11/560,459, filed on Nov. 16, 2006, now Pat. No. 7,598,173, which is a division of application No. 10/904,160, filed on Oct. 27, 2004, (Continued)

(51) Int. Cl.
 *H01L 29/76* (2006.01)
 *H01L 29/94* (2006.01)
 *H01L 31/062* (2012.01)
 *H01L 31/113* (2006.01)
 *H01L 31/119* (2006.01)
(52) U.S. Cl. .................. 257/288; 257/368; 438/478
(58) Field of Classification Search ............ 258/88, 258/288, E21.409, E29.255, 368, E21.09; 438/197, 669
See application file for complete search history.

(56) References Cited

U.S. PATENT DOCUMENTS

| 3,668,106 | A | 6/1972 | Ota |
| 3,756,693 | A | 9/1973 | Ota |
| 3,767,392 | A | 10/1973 | Ota |
| 3,792,308 | A | 2/1974 | Ota |
| 3,870,517 | A | 3/1975 | Ota et al. |
| 3,892,568 | A | 7/1975 | Ota |
| 4,068,927 | A | 1/1978 | White |
| 4,418,346 | A | 11/1983 | Batchelder |

(Continued)

FOREIGN PATENT DOCUMENTS

| DE | 41 08 818 A1 | 9/1992 |
| EP | 0 981 065 | 2/2000 |

(Continued)

OTHER PUBLICATIONS

Amundson, K., "Electrophoretic Imaging Films for Electronic Paper Displays" in Crawford, G. ed. Flexible Flat Panal Displays, John Wiley & Sons, Ltd., Hoboken, NJ: 2005.

(Continued)

*Primary Examiner* — Phuc Dang
(74) *Attorney, Agent, or Firm* — David J. Cole

(57) ABSTRACT

An electro-optic display comprises a substrate (100), non-linear devices (102) disposed substantially in one plane on the substrate (100), pixel electrodes (106) connected to the non-linear devices (102), an electro-optic medium (110) and a common electrode (112) on the opposed side of the electro-optic medium (110) from the pixel electrodes (106). The moduli of the various parts of the display are arranged so that, when the display is curved, the neutral axis or neutral plane lies substantially in the plane of the non-linear devices (102).

7 Claims, 7 Drawing Sheets

Related U.S. Application Data now Pat. No. 7,190,008, which is a continuation-in-part of application No. 10/249,618, filed on Apr. 24, 2003, now Pat. No. 7,116,318.

(60) Provisional application No. 60/375,571, filed on Apr. 24, 2002, provisional application No. 60/375,508, filed on Apr. 24, 2002, provisional application No. 60/481,565, filed on Oct. 27, 2003, provisional application No. 60/481,591, filed on Nov. 3, 2003.

(56) References Cited

U.S. PATENT DOCUMENTS

| | | | |
|---|---|---|---|
| 5,045,150 | A | 9/1991 | Cleeves et al. |
| 5,238,861 | A | 8/1993 | Morin et al. |
| 5,469,278 | A | 11/1995 | Takahara et al. |
| 5,583,673 | A | 12/1996 | Onishi et al. |
| 5,614,427 | A | 3/1997 | den Boer et al. |
| 5,665,492 | A | 9/1997 | Sotomura |
| 5,672,524 | A | 9/1997 | Liu et al. |
| 5,715,026 | A | 2/1998 | Shannon |
| 5,721,164 | A | 2/1998 | Wu |
| 5,734,452 | A | 3/1998 | Yamaue et al. |
| 5,745,094 | A | 4/1998 | Gordon, II et al. |
| 5,760,761 | A | 6/1998 | Sheridon |
| 5,777,782 | A | 7/1998 | Sheridon |
| 5,801,075 | A * | 9/1998 | Gardner et al. ............... 438/197 |
| 5,808,783 | A | 9/1998 | Crowley |
| 5,847,413 | A | 12/1998 | Yamazaki et al. |
| 5,872,552 | A | 2/1999 | Gordon, II et al. |
| 5,930,026 | A | 7/1999 | Jacobson et al. |
| 5,961,804 | A | 10/1999 | Jacobson et al. |
| 5,994,173 | A * | 11/1999 | Oki et al. ....................... 438/161 |
| 6,017,584 | A | 1/2000 | Albert et al. |
| 6,027,958 | A | 2/2000 | Vu et al. |
| 6,054,071 | A | 4/2000 | Mikkelsen, Jr. |
| 6,055,091 | A | 4/2000 | Sheridon et al. |
| 6,067,185 | A | 5/2000 | Albert et al. |
| 6,087,256 | A | 7/2000 | Wada |
| 6,097,531 | A | 8/2000 | Sheridon |
| 6,118,426 | A | 9/2000 | Albert et al. |
| 6,120,588 | A | 9/2000 | Jacobson |
| 6,120,839 | A | 9/2000 | Comiskey et al. |
| 6,124,851 | A | 9/2000 | Jacobson |
| 6,128,124 | A | 10/2000 | Silverman |
| 6,130,773 | A | 10/2000 | Jacobson et al. |
| 6,130,774 | A | 10/2000 | Albert et al. |
| 6,137,467 | A | 10/2000 | Sheridon et al. |
| 6,144,361 | A | 11/2000 | Gordon, II et al. |
| 6,147,791 | A | 11/2000 | Sheridon |
| 6,171,956 | B1 | 1/2001 | Lou |
| 6,172,798 | B1 | 1/2001 | Albert et al. |
| 6,177,921 | B1 | 1/2001 | Comiskey et al. |
| 6,184,856 | B1 | 2/2001 | Gordon, II et al. |
| 6,200,866 | B1 * | 3/2001 | Ma et al. ....................... 438/299 |
| 6,225,971 | B1 | 5/2001 | Gordon, II et al. |
| 6,232,157 | B1 | 5/2001 | Dodabalapur et al. |
| 6,232,950 | B1 | 5/2001 | Albert et al. |
| 6,241,921 | B1 | 6/2001 | Jacobson et al. |
| 6,249,271 | B1 | 6/2001 | Albert et al. |
| 6,252,564 | B1 | 6/2001 | Albert et al. |
| 6,262,706 | B1 | 7/2001 | Albert et al. |
| 6,262,833 | B1 | 7/2001 | Loxley et al. |
| 6,271,823 | B1 | 8/2001 | Gordon, II et al. |
| 6,278,165 | B1 * | 8/2001 | Oowaki et al. ............... 257/410 |
| 6,300,932 | B1 | 10/2001 | Albert |
| 6,301,038 | B1 | 10/2001 | Fitzmaurice et al. |
| 6,312,304 | B1 | 11/2001 | Duthaler et al. |
| 6,312,971 | B1 | 11/2001 | Amundson et al. |
| 6,323,034 | B1 | 11/2001 | Chen et al. |
| 6,323,989 | B1 | 11/2001 | Jacobson et al. |
| 6,327,072 | B1 | 12/2001 | Comiskey et al. |
| 6,376,828 | B1 | 4/2002 | Comiskey |
| 6,377,387 | B1 | 4/2002 | Duthaler et al. |
| 6,383,942 | B1 | 5/2002 | Narita et al. |
| 6,392,785 | B1 | 5/2002 | Albert et al. |
| 6,392,786 | B1 | 5/2002 | Albert |
| 6,413,790 | B1 | 7/2002 | Duthaler et al. |
| 6,422,687 | B1 | 7/2002 | Jacobson |
| 6,445,374 | B2 | 9/2002 | Albert et al. |
| 6,445,489 | B1 | 9/2002 | Jacobson et al. |
| 6,459,418 | B1 | 10/2002 | Comiskey et al. |
| 6,473,072 | B1 | 10/2002 | Comiskey et al. |
| 6,480,182 | B2 | 11/2002 | Turner et al. |
| 6,498,114 | B1 | 12/2002 | Amundson et al. |
| 6,504,524 | B1 | 1/2003 | Gates et al. |
| 6,506,438 | B2 | 1/2003 | Duthaler et al. |
| 6,512,354 | B2 | 1/2003 | Jacobson et al. |
| 6,515,649 | B1 | 2/2003 | Albert et al. |
| 6,518,123 | B2 * | 2/2003 | Lin ............................... 438/257 |
| 6,518,949 | B2 | 2/2003 | Drzaic |
| 6,521,489 | B2 | 2/2003 | Duthaler et al. |
| 6,525,795 | B1 | 2/2003 | Nishi et al. |
| 6,531,997 | B1 | 3/2003 | Gates et al. |
| 6,535,197 | B1 | 3/2003 | Comiskey et al. |
| 6,538,801 | B2 | 3/2003 | Jacobson et al. |
| 6,545,291 | B1 | 4/2003 | Amundson et al. |
| 6,580,545 | B2 | 6/2003 | Morrison et al. |
| 6,605,227 | B2 | 8/2003 | Yoshida et al. |
| 6,639,578 | B1 | 10/2003 | Comiskey et al. |
| 6,652,075 | B2 | 11/2003 | Jacobson |
| 6,657,772 | B2 | 12/2003 | Loxley |
| 6,664,944 | B1 | 12/2003 | Albert et al. |
| D485,294 | S | 1/2004 | Albert |
| 6,672,921 | B1 | 1/2004 | Liang et al. |
| 6,680,725 | B1 | 1/2004 | Jacobson |
| 6,683,333 | B2 | 1/2004 | Kazlas et al. |
| 6,693,620 | B1 | 2/2004 | Herb et al. |
| 6,704,133 | B2 | 3/2004 | Gates et al. |
| 6,710,540 | B1 | 3/2004 | Albert et al. |
| 6,721,083 | B2 | 4/2004 | Jacobson et al. |
| 6,724,519 | B1 | 4/2004 | Comiskey et al. |
| 6,727,881 | B1 | 4/2004 | Albert et al. |
| 6,738,050 | B2 | 5/2004 | Comiskey et al. |
| 6,750,473 | B2 | 6/2004 | Amundson et al. |
| 6,753,999 | B2 | 6/2004 | Zehner et al. |
| 6,788,449 | B2 | 9/2004 | Liang et al. |
| 6,791,144 | B1 * | 9/2004 | Fryer et al. ................... 257/349 |
| 6,815,297 | B1 * | 11/2004 | Krivokapic et al. .......... 438/287 |
| 6,816,147 | B2 | 11/2004 | Albert |
| 6,819,471 | B2 | 11/2004 | Amundson et al. |
| 6,822,782 | B2 | 11/2004 | Honeyman et al. |
| 6,825,068 | B2 | 11/2004 | Denis et al. |
| 6,825,829 | B1 | 11/2004 | Albert et al. |
| 6,825,970 | B2 | 11/2004 | Goenaga et al. |
| 6,831,769 | B2 | 12/2004 | Holman et al. |
| 6,839,158 | B2 | 1/2005 | Albert et al. |
| 6,842,167 | B2 | 1/2005 | Albert et al. |
| 6,842,279 | B2 | 1/2005 | Amundson |
| 6,842,657 | B1 | 1/2005 | Drzaic et al. |
| 6,864,875 | B2 | 3/2005 | Drzaic et al. |
| 6,865,010 | B2 | 3/2005 | Duthaler et al. |
| 6,866,760 | B2 | 3/2005 | Paolini, Jr. et al. |
| 6,870,657 | B1 | 3/2005 | Fitzmaurice et al. |
| 6,870,661 | B2 | 3/2005 | Pullen et al. |
| 6,900,851 | B2 | 5/2005 | Morrison et al. |
| 6,922,276 | B2 | 7/2005 | Zhang et al. |
| 6,950,220 | B2 | 9/2005 | Abramson et al. |
| 6,958,848 | B2 | 10/2005 | Cao et al. |
| 6,967,640 | B2 | 11/2005 | Albert et al. |
| 6,980,196 | B1 | 12/2005 | Turner et al. |
| 6,982,178 | B2 | 1/2006 | LeCain et al. |
| 6,987,603 | B2 | 1/2006 | Paolini, Jr. et al. |
| 6,995,550 | B2 | 2/2006 | Jacobson et al. |
| 7,112,478 | B2 | 9/2006 | Grupp et al. |
| 2002/0060321 | A1 | 5/2002 | Kazlas et al. |
| 2002/0063661 | A1 | 5/2002 | Comiskey et al. |
| 2002/0090980 | A1 | 7/2002 | Wilcox et al. |
| 2002/0113770 | A1 | 8/2002 | Jacobson et al. |
| 2002/0130832 | A1 | 9/2002 | Baucom et al. |
| 2002/0180687 | A1 | 12/2002 | Webber |
| 2003/0011560 | A1 | 1/2003 | Albert et al. |
| 2003/0102858 | A1 | 6/2003 | Jacobson et al. |
| 2003/0132908 | A1 | 7/2003 | Herb et al. |

| | | | |
|---|---|---|---|
| 2003/0137521 A1 | 7/2003 | Zehner et al. | |
| 2003/0151702 A1 | 8/2003 | Morrison et al. | |
| 2003/0222315 A1 | 12/2003 | Amundson et al. | |
| 2004/0014265 A1 | 1/2004 | Kazlas et al. | |
| 2004/0075634 A1 | 4/2004 | Gates | |
| 2004/0094422 A1 | 5/2004 | Pullen et al. | |
| 2004/0105036 A1 | 6/2004 | Danner et al. | |
| 2004/0112750 A1 | 6/2004 | Jacobson et al. | |
| 2004/0119681 A1 | 6/2004 | Albert et al. | |
| 2004/0136048 A1 | 7/2004 | Arango et al. | |
| 2004/0155857 A1 | 8/2004 | Duthaler et al. | |
| 2004/0180476 A1 | 9/2004 | Kazlas et al. | |
| 2004/0190114 A1 | 9/2004 | Jacobson et al. | |
| 2004/0196215 A1 | 10/2004 | Duthaler et al. | |
| 2004/0226820 A1 | 11/2004 | Webber et al. | |
| 2004/0239614 A1 | 12/2004 | Amundson et al. | |
| 2004/0252360 A1 | 12/2004 | Webber et al. | |
| 2004/0257635 A1 | 12/2004 | Paolini, Jr. et al. | |
| 2004/0263947 A1 | 12/2004 | Drzaic et al. | |
| 2005/0000813 A1 | 1/2005 | Pullen et al. | |
| 2005/0001812 A1 | 1/2005 | Amundson et al. | |
| 2005/0007336 A1 | 1/2005 | Albert et al. | |
| 2005/0007653 A1 | 1/2005 | Honeyman et al. | |
| 2005/0012980 A1 | 1/2005 | Wilcox et al. | |
| 2005/0017944 A1 | 1/2005 | Albert | |
| 2005/0018273 A1 | 1/2005 | Honeyman et al. | |
| 2005/0024353 A1 | 2/2005 | Amundson et al. | |
| 2005/0035941 A1 | 2/2005 | Albert et al. | |
| 2005/0041004 A1 | 2/2005 | Gates et al. | |
| 2005/0062714 A1 | 3/2005 | Zehner et al. | |
| 2005/0067656 A1 | 3/2005 | Denis et al. | |
| 2005/0105159 A1 | 5/2005 | Paolini, Jr. et al. | |
| 2005/0122563 A1 | 6/2005 | Honeyman et al. | |
| 2005/0151709 A1 | 7/2005 | Jacobson et al. | |
| 2005/0168799 A1 | 8/2005 | Whitesides et al. | |

FOREIGN PATENT DOCUMENTS

| | | | |
|---|---|---|---|
| EP | 1 145072 B1 | 5/2003 | |
| JP | 02-211672 | 8/1980 | |
| JP | 04-304428 | 10/1992 | |
| JP | 05-005871 | 1/1993 | |
| JP | 11-337918 | 12/1999 | |
| JP | 2000-269510 | 9/2000 | |
| JP | 07-168167 | 4/2008 | |
| WO | WO 00/05704 | 2/2000 | |
| WO | WO 00/36560 | 6/2000 | |
| WO | WO 00/38000 | 6/2000 | |
| WO | WO 00/67110 | 11/2000 | |
| WO | WO 00/67327 | 11/2000 | |
| WO | WO 01/07961 | 2/2001 | |
| WO | WO 03/107315 | 12/2003 | |

OTHER PUBLICATIONS

Amundson, K. et al., "Flexible, Active-Matrix Display Constructed Using a Microencapsulated Electrophoretic Material and an Organic-Semiconductor-Based Backplane", SID 01 Digest, 160 (Jun. 2001).

Au, J. et al., "Ultra-Thin 3.1-in. Active-Matrix Electronic Ink Display for Mobile Devices", IDW'02, 223 (2002).

Bach, U., et al., "Nanomaterials-Based Electrochromics for Paper-Quality Displays", Adv. Mater, 14(11), 845 (2002).

Bouchard, A. et al., "High-Resolution Microencapsulated Electrophoretic Display on Silicon", SID 04 Digest, 651 (2004).

Caillot, E. et al. "Active Matrix Electrophoretic Information Display for High Performance Mobile Devices", IDMC Proceedings (2003).

Chen, Y., et al., "A Conformable Electronic Ink Display using a Foil-Based a-Si TFT Array", SID 01 Digest, 157 (Jun. 2001).

Comiskey, B., et al., "An electrophoretic ink for at-printed reflective electronic displays", Nature, 394, 253 (1998).

Comiskey, B., et al., "Electrophoretic Ink: A Printable Display Material", SID 97 Digest (1997), p. 75.

Danner, G.M. et al., "Reliability Performance for Microencapsulated Electrophoretic Displays with Simulated Active Matrix Drive", SID 03 Digest, 573 (2003).

Drzaic, P., et al., "A Printed and Rollable Bistable Electronic Display", SID 96 Digest (1998), p. 1131.

Duthaler, G., et al., "Active-Matrix Color Displays Using Electrophoretic Ink and Color Filters", SID 02 Digest, 1374 (2002).

Henzen, A. et al., "An Electronic Ink Low Latent Drawing Tablet", SID 04 Digest, 1070 (2004).

Henzen, A. et al., "Development of Active Matrix Electronic Ink Displays for Handheld Devices", SID 03 Digest, 176, (2003).

Henzen, A. et al., "Development of Active Matrix Electronic Ink Displays for Smart Handheld Applications", IDW'02, 227 (2002).

Jacobson, J. et al., "The last book", IBM Systems J., 36, 457 (1997).

Jo, G-R, et al., "Toner Display Based on Particle Movements", Chem. Mater, 14, 664 (2002).

Kazlas, P. et al., "Card-size Active-matrix Electronic Ink Display", Eurodisplay 2002, 259 (2002).

Kazlas, P., et al., "12.1" SVGA Microencapsulated Electrophoretic Active Matrix Display for Information Applicances, SID 01 Digest, 152 (Jun. 2001).

Kitamura, T., et al., "Electrical toner movement for electronic paper-like display", Asia Display/IDW '01, p. 1517, Paper HCS1-1 (2001).

Ma, E.Y. et al., "Thin Film Transistors For Foldable Displays", IEDM 97, 535-538, (1997).

O'Regan, B. et al., "A Low Cost, High-efficiency Solar Cell Based on Dye-sensitized colloidal TiO2 Films", Nature, vol. 353, Oct. 24, 1991, 773-740.

Pitt, M.G., et al., "Power Consumption of Microencapsulated Electrophoretic Displays for Smart Handheld Applications", SID 02 Digest, 1378 (2002).

Rogers, J.A. et al., "Paper-like electronic displays: Large-area rubber-stamped plastic sheets of electronics and microencapsuiated electrophoretic inks" PNAS, Apr. 24, 2001, vol. 98, No. 9, 4835-4340 (2001).

Suo, Z., et al., "Mechanics of rollable and foldable film-on-foil electronics", App. Phys. Lett., 74, 1177 (1999).

Webber, R., "Image Stability in Active-Matrix Microencapsulated Electrophoretic Displays", SID 02 Digest, 126 (2002).

Whitesides, T. et al., "Towards Video-rate Microencapsulated Dual-Particle Electrophoretic Displays", SID 04 Digest, 133 (2004).

Wood, D., "An Electrochromic Renaissance?" Information Display, 18(3), 24 (Mar. 2002).

Yamaguchi, Y., et al., "Toner display using insulative particles charged triboelectrically", Asia Display/IDW '01, p. 1729, Paper AMD4-4 (2001).

Zehner, R. et al., "Drive Waveforms for Active Matrix Electrophoretic Displays", SID 03 Digest, 842 (2003).

* cited by examiner

FIELD EFFECT TRANSISTOR

REFERENCE TO RELATED APPLICATIONS

This application is a divisional of application Ser. No. 12/552,334, filed Sep. 2, 2009 (Publication No. 2009/0315044, now abandoned), which is a divisional of application Ser. No. 11/560,459, filed Nov. 16, 2006 (Publication No. 2007/0069247, now U.S. Pat. No. 7,598,173, issued Oct. 6, 2009), which itself is a divisional of application Ser. No. 10/904,160, filed Oct. 27, 2004 (Publication No. 2005/0078099, now U.S. Pat. No. 7,190,008, issued Mar. 13, 2007), which itself is a continuation-in-part of application Ser. No. 10/249,618, filed Apr. 24, 2003 (Publication No. 2003/0222315, now U.S. Pat. No. 7,116,318), which claims benefit of application Ser. Nos. 60/375,571 and 60/375,508, both filed Apr. 24, 2002.

The aforementioned application Ser. No. 10/904,160 also claims benefit of application Ser. No. 60/481,565, filed Oct. 27, 2003 and application Ser. No. 60/481,591, filed Nov. 3, 2003.

This application is also related to (a) application Ser. No. 10/249,624 filed Apr. 24, 2003 (Publication No. 2004/0014265, now U.S. Pat. No. 7,223,672), which claims benefit of application Ser. No. 60/375,248, filed Apr. 24, 2002, and application Ser. No. 60/376,603, filed Apr. 30, 2002; (b) application Ser. No. 09/565,413, filed May 5, 2000 (now U.S. Pat. No. 7,030,412); (c) application Ser. No. 09/904,109, filed Jul. 12, 2001 (now U.S. Pat. No. 6,683,333); (d) application Ser. No. 10/065,795, filed Nov. 20, 2002 (Publication No. 2003/0137521, now U.S. Pat. No. 7,012,600); (e) application Ser. No. 10/707,184, filed Nov. 25, 2003 (Publication No. 2004/0180476); and (f) application Ser. No. 10/711,829, filed Oct. 7, 2004 (Publication No. 2005/0168799, now U.S. Pat. No. 7,230,750).

The entire contents of the aforementioned applications are herein incorporated by reference. The entire contents of all United States Patents and copending and published Applications mentioned below are also herein incorporated by reference.

BACKGROUND OF INVENTION

The present invention relates to electro-optic displays and to components, especially backplanes, for use in such displays. The present invention is especially, though not exclusively, intended for use in such displays based on stainless steel or similar metal foil substrates.

In the displays of the present invention, the electro-optic medium will typically be a solid (such displays may hereinafter for convenience be referred to as "solid electro-optic displays"), in the sense that the electro-optic medium has solid external surfaces, although the medium may, and often does, have internal liquid- or gas-filled spaces, and to methods for assembling displays using such an electro-optic medium. Thus, the term "solid electro-optic displays" includes encapsulated electrophoretic displays, encapsulated liquid crystal displays, and other types of displays discussed below. Certain aspects of the present invention are primarily, although not exclusively, intended for use with encapsulated electrophoretic displays.

The term "electro-optic", as applied to a material or a display, is used herein in its conventional meaning in the imaging art to refer to a material having first and second display states differing in at least one optical property, the material being changed from its first to its second display state by application of an electric field to the material. Although the optical property is typically color perceptible to the human eye, it may be another optical property, such as optical transmission, reflectance, luminescence or, in the case of displays intended for machine reading, pseudo-color in the sense of a change in reflectance of electromagnetic wavelengths outside the visible range.

The term "gray state" is used herein in its conventional meaning in the imaging art to refer to a state intermediate two extreme optical states of a pixel, and does not necessarily imply a black-white transition between these two extreme states. For example, several of the patents and published applications referred to below describe electrophoretic displays in which the extreme states are white and deep blue, so that an intermediate "gray state" would actually be pale blue. Indeed, as already mentioned the transition between the two extreme states may not be a color change at all.

The terms "bistable" and "bistability" are used herein in their conventional meaning in the art to refer to displays comprising display elements having first and second display states differing in at least one optical property, and such that after any given element has been driven, by means of an addressing pulse of finite duration, to assume either its first or second display state, after the addressing pulse has terminated, that state will persist for at least several times, for example at least four times, the minimum duration of the addressing pulse required to change the state of the display element. It is shown in published U.S. Patent Application No. 2002/0180687 that some particle-based electrophoretic displays capable of gray scale are stable not only in their extreme black and white states but also in their intermediate gray states, and the same is true of some other types of electro-optic displays. This type of display is properly called "multi-stable" rather than bistable, although for convenience the term "bistable" may be used herein to cover both bistable and multi-stable displays.

Several types of electro-optic displays are known. One type of electro-optic display is a rotating bichromal member type as described, for example, in U.S. Pat. Nos. 5,808,783; 5,777,782; 5,760,761; 6,054,071; 6,055,091; 6,097,531; 6,128,124; 6,137,467; and 6,147,791 (although this type of display is often referred to as a "rotating bichromal ball" display, the term "rotating bichromal member" is preferred as more accurate since in some of the patents mentioned above the rotating members are not spherical). Such a display uses a large number of small bodies (typically spherical or cylindrical) which have two or more sections with differing optical characteristics, and an internal dipole. These bodies are suspended within liquid-filled vacuoles within a matrix, the vacuoles being filled with liquid so that the bodies are free to rotate. The appearance of the display is changed to applying an electric field thereto, thus rotating the bodies to various positions and varying which of the sections of the bodies is seen through a viewing surface. This type of electro-optic medium is typically bistable.

Another type of electro-optic display uses an electrochromic medium, for example an electrochromic medium in the form of a nanochromic film comprising an electrode formed at least in part from a semi-conducting metal oxide and a plurality of dye molecules capable of reversible color change attached to the electrode; see, for example O'Regan, B., et al., Nature 1991, 353, 737; and Wood, D., Information Display, 18(3), 24 (March 2002). See also Bach, U., et al., Adv. Mater., 2002, 14(11), 845. Nanochromic films of this type are also described, for example, in U.S. Pat. No. 6,301,038, International Application Publication No. WO 01/27690, and in U.S. Patent Application 2003/0214695. This type of medium is also typically bistable.

Another type of electro-optic display, which has been the subject of intense research and development for a number of years, is the particle-based electrophoretic display, in which a plurality of charged particles move through a suspending fluid under the influence of an electric field. Electrophoretic displays can have attributes of good brightness and contrast, wide viewing angles, state bistability, and low power consumption when compared with liquid crystal displays. Nevertheless, problems with the long-term image quality of these displays have prevented their widespread usage. For example, particles that make up electrophoretic displays tend to settle, resulting in inadequate service-life for these displays.

Numerous patents and applications assigned to or in the names of the Massachusetts Institute of Technology (MIT) and E Ink Corporation have recently been published describing encapsulated electrophoretic media. Such encapsulated media comprise numerous small capsules, each of which itself comprises an internal phase containing electrophoretically-mobile particles suspended in a liquid suspending medium, and a capsule wall surrounding the internal phase. Typically, the capsules are themselves held within a polymeric binder to form a coherent layer positioned between two electrodes. Encapsulated media of this type are described, for example, in U.S. Pat. Nos. 5,930,026; 5,961,804; 6,017,584; 6,067,185; 6,118,426; 6,120,588; 6,120,839; 6,124,851; 6,130,773; 6,130,774; 6,172,798; 6,177,921; 6,232,950; 6,249,271; 6,252,564; 6,262,706; 6,262,833; 6,300,932; 6,312,304; 6,312,971; 6,323,989; 6,327,072; 6,376,828; 6,377,387; 6,392,785; 6,392,786; 6,413,790; 6,422,687; 6,445,374; 6,445,489; 6,459,418; 6,473,072; 6,480,182; 6,498,114; 6,504,524; 6,506,438; 6,512,354; 6,515,649; 6,518,949; 6,521,489; 6,531,997; 6,535,197; 6,538,801; 6,545,291; 6,580,545; 6,639,578; 6,652,075; 6,657,772; 6,664,944; 6,680,725; 6,683,333; 6,704,133; 6,710,540; 6,721,083; 6,727,881; 6,738,050; 6,750,473; and 6,753,999; and U.S. Patent Applications Publication Nos. 2002/0019081; 2002/0021270; 2002/0060321; 2002/0063661; 2002/0090980; 2002/0113770; 2002/0130832; 2002/0131147; 2002/0171910; 2002/0180687; 2002/0180688; 2002/0185378; 2003/0011560; 2003/0020844; 2003/0025855; 2003/0038755; 2003/0053189; 2003/0102858; 2003/0132908; 2003/0137521; 2003/0137717; 2003/0151702; 2003/0214695; 2003/0214697; 2003/0222315; 2004/0008398; 2004/0012839; 2004/0014265; 2004/0027327; 2004/0075634; 2004/0094422; 2004/0105036; 2004/0112750; and 2004/0119681; and International Applications Publication Nos. WO 99/67678; WO 00/05704; WO 00/38000; WO 00/38001; W000/36560; WO 00/67110; WO 00/67327; WO 01/07961; WO 01/08241; WO 03/107,315; WO 2004/023195; and WO 2004/049045.

Many of the aforementioned patents and applications recognize that the walls surrounding the discrete microcapsules in an encapsulated electrophoretic medium could be replaced by a continuous phase, thus producing a so-called polymer-dispersed electrophoretic display, in which the electrophoretic medium comprises a plurality of discrete droplets of an electrophoretic fluid and a continuous phase of a polymeric material, and that the discrete droplets of electrophoretic fluid within such a polymer-dispersed electrophoretic display may be regarded as capsules or microcapsules even though no discrete capsule membrane is associated with each individual droplet; see for example, the aforementioned 2002/0131147. Accordingly, for purposes of the present application, such polymer-dispersed electrophoretic media are regarded as sub-species of encapsulated electrophoretic media.

A related type of electrophoretic display is a so-called "microcell electrophoretic display". In a microcell electrophoretic display, the charged particles and the suspending fluid are not encapsulated within microcapsules but instead are retained within a plurality of cavities formed within a carrier medium, typically a polymeric film. See, for example, International Application Publication No. WO 02/01281, and published US Application No. 2002/0075556, both assigned to Sipix Imaging, Inc.

Although electrophoretic media are often opaque (since, for example, in many electrophoretic media, the particles substantially block transmission of visible light through the display) and operate in a reflective mode, many electrophoretic displays can be made to operate in a so-called "shutter mode" in which one display state is substantially opaque and one is light-transmissive. See, for example, the aforementioned U.S. Pat. Nos. 6,130,774 and 6,172,798, and U.S. Pat. Nos. 5,872,552; 6,144,361; 6,271,823; 6,225,971; and 6,184,856. Dielectrophoretic displays, which are similar to electrophoretic displays but rely upon variations in electric field strength, can operate in a similar mode; see U.S. Pat. No. 4,418,346. Other types of electro-optic displays may also be capable of operating in shutter mode.

An encapsulated or microcell electrophoretic display typically does not suffer from the clustering and settling failure mode of traditional electrophoretic devices and provides further advantages, such as the ability to print or coat the display on a wide variety of flexible and rigid substrates. (Use of the word "printing" is intended to include all forms of printing and coating, including, but without limitation: pre-metered coatings such as patch die coating, slot or extrusion coating, slide or cascade coating, curtain coating; roll coating such as knife over roll coating, forward and reverse roll coating; gravure coating; dip coating; spray coating; meniscus coating; spin coating; brush coating; air knife coating; silk screen printing processes; electrostatic printing processes; thermal printing processes; ink jet printing processes; and other similar techniques.) Thus, the resulting display can be flexible. Further, because the display medium can be printed (using a variety of methods), the display itself can be made inexpensively.

Whether a display is reflective or transmissive, and whether or not the electro-optic medium used is bistable, to obtain a high-resolution display, individual pixels of a display must be addressable without interference from adjacent pixels. One way to achieve this objective is to provide an array of non-linear elements, such as transistors or diodes, with at least one non-linear element is associated with each pixel, to produce an "active matrix" display. An addressing or pixel electrode, which addresses one pixel, is connected to an appropriate voltage source through the associated non-linear element. Typically, when the non-linear element is a transistor, the pixel electrode is connected to the drain of the transistor, and this arrangement will be assumed in the following description, although it is essentially arbitrary and the pixel electrode could be connected to the source of the transistor. Conventionally, in high resolution arrays, the pixels are arranged in a two-dimensional array of rows and columns, such that any specific pixel is uniquely defined by the intersection of one specified row and one specified column. The sources of all the transistors in each column are connected to a single column electrode, while the gates of all the transistors in each row are connected to a single row electrode; again the assignment of sources to rows and gates to columns is conventional but essentially arbitrary, and could be reversed if desired. The row electrodes are connected to a row driver, which essentially ensures that at any given moment only one row is selected, i.e., that there is applied to the selected row electrode a voltage such as to ensure that all the transistors in the selected row are conductive, while there is applied to all other rows a voltage such as to ensure that all the transistors in these non-selected rows remain non-conductive. The column electrodes are connected to column drivers, which place upon the various column electrodes voltages selected to drive the pixels in the selected row to their desired optical states. (The aforementioned voltages are relative to a common front electrode which is conventionally provided on the opposed side of the electro-optic medium from the non-linear array and extends across the whole display.) After a pre-selected interval known as the "line address time" the selected row is deselected, the next row is selected, and the voltages on the column drivers are changed to that the next line of the display is written. This process is repeated so that the entire display is written in a row-by-row manner. Thus, in a display with N rows, any given pixel can only be addressed for a fraction 1/N of the time.

Processes for manufacturing active matrix displays are well established. Thin-film transistors, for example, can be fabricated using various deposition and photolithography techniques. A transistor includes a gate electrode, an insulating dielectric layer, a semiconductor layer and source and drain electrodes. Application of a voltage to the gate electrode provides an electric field across the dielectric layer, which dramatically increases the source-to-drain conductivity of the semiconductor layer. This change permits electrical conduction between the source and the drain electrodes. Typically, the gate electrode, the source electrode, and the drain electrode are patterned. In general, the semiconductor layer is also patterned in order to minimize stray conduction (i.e., cross-talk) between neighboring circuit elements.

Liquid crystal displays commonly employ amorphous silicon ("a-Si") thin-film transistors ("TFT's") as switching devices for display pixels. Such TFT's typically have a bottom-gate configuration. Within one pixel, a thin-film capacitor typically holds a charge transferred by the switching TFT. Electrophoretic displays can use similar TFT's with capacitors, although the function of the capacitors differs somewhat from those in liquid crystal displays; see copending application Ser. No. 09/565,413, filed May 5, 2000 (now U.S. Pat. No. 7,030,412), U.S. Patent Publication No 2002/0106847 and the aforementioned 2002/0060321. Thin-film transistors can be fabricated to provide high performance. Fabrication processes, however, can result in significant cost.

In TFT addressing arrays, pixel electrodes are charged via the TFT's during a line address time. During the line address time, a TFT is switched to a conducting state by changing an applied gate voltage. For example, for an n-type TFT, a gate voltage is switched to a "high" state to switch the TFT into a conducting state.

Many electro-optic materials require application of a drive voltage for a significant switching time (typically of the order of $10^{-2}$ to $10^{-1}$ seconds) to effect a transition between their two extreme optical states. For high resolution displays containing at least (say) 100 rows and columns, if a reasonable scan rate is to be maintained, the period for which an individual pixel is addressed during a single scan is much less than the switching time of the electro-optic medium, and accordingly much of the switching of a pixel is effected by the voltage which remains on the pixel electrode between successive times of addressing the pixel (i.e., while other columns of the display are being addressed). This remaining voltage gradually decays due to current passing through the electro-optic material of the pixel and any current leakage through the non-linear element. The rate at which this decay occurs can be reduced (and the average voltage applied to the pixel during one complete scan of the display thus increased—this is commonly referred to as "increasing the voltage holding capacity" of the pixel) by connecting the pixel electrode to a capacitor.

At least some of the aforementioned electro-optic media can be made sufficiently flexible to permit their use in flexible displays based upon flexible substrates such as metal or polymeric films. Some recent publications of previous related work applied to electrophoretic displays on steel foil substrates and related technologies include:

Y. Chen, P. Kazlas, K. Denis and P. Drzaic, in *SID Intl. Symp. Digest Tech. Papers, San Jose* 2001 (Society of Information Display, San Jose) p. 157;

P. Kazlas, A. Ritenour, J. Au, Y. Chen, J. Goodman, R. Paolini and H. Gates, in *22nd Intl. Display Research Conference Nice* 2002 (Society of Information Display, San Jose);

Au, Y. Chen, A. Ritenour, P. Kazlas and H. Gates, 9th Intl. Display Workshops Hiroshima 2002 (Society of Information Display, San Jose);

Suo et al., Mechanics of rollable and foldable film-on-foil electronics, App. Phys. Lett., 74, 1177 (22 Feb. 1999).

However, manufacturing flexible microelectronic backplanes for such displays presents many challenges. A key problem in the manufacture and operation of such thin film transistors on flexible substrates is thin film cracking Typically, the a-Si films used can withstand between 1-2% strain before cracking.

In one aspect, the present invention relates to backplane and display structures designed to minimize the cracking problems in electro-optic displays. In other aspects, the present invention relates to various improvements in backplanes for electro-optic displays, components for use in such backplanes and processes for the manufacture of such backplanes, which improvements may be useful in overcoming the aforementioned problems.

SUMMARY OF THE INVENTION

In one aspect, this invention provides an electro-optic display comprising:
    a substrate;
    a plurality of non-linear devices disposed substantially in one plane on the substrate;
    a plurality of pixel electrodes in electrical communication with the non-linear devices;
    a layer of electro-optic medium; and
    a common electrode on the opposed side of the layer of electro-optic medium from the pixel electrodes,
    wherein the moduli of the various parts of the display are such that, when the display is curved, the neutral axis or neutral plane lies substantially in the plane of the non-linear devices.

This electro-optic display may hereinafter for convenience be called the "controlled moduli" display of the invention. In such a display, it is generally preferred that the neutral axis or neutral plane not deviate from the plane of the non-linear devices by more than about 5 percent, and desirably not more than about 1 percent, of the total thickness of the display. A layer of dielectric material may be interposed between the non-linear devices and the pixel electrodes, and conductive vias provided extending through the layer of dielectric material and connecting the pixel electrodes to the non-linear devices.

In another aspect, this invention provides a process for producing a plurality of non-linear devices on a substrate, the process comprising:

forming an unpatterned layer of semiconductor material on the substrate;

forming at least two discrete areas of metal overlying the unpatterned semiconductor layer; and etching the semiconductor layer using the discrete areas of metal as a mask, thereby patterning the layer of semiconductor material to leave at least two discrete areas of semiconductor material underlying the at least two discrete areas of metal.

This process may hereinafter for convenience be called the "internal mask" process of the invention. This process may further comprise depositing a dielectric layer over the layer of semiconductor material before forming the at least two discrete areas of metal, and etching both the dielectric layer and the layer of semiconductor material in the same etching step, thereby forming at least two discrete areas of dielectric between the discrete areas of metal and the discrete areas of semiconductor material. Also, the at least two discrete areas of metal may be formed by depositing an unpatterned layer of metal over the semiconductor and thereafter patterning the layer of metal to form the at least two discrete areas of metal.

One useful form of the internal mask process comprises:

forming the unpatterned layer of semiconductor material on the substrate;

forming at least two discrete areas of a first metal layer overlying the layer of semiconductor material, each of the at least two discrete areas forming an electrode of a transistor;

forming a dielectric layer overlying the first metal layer and the layer of semiconductor material;

forming at least two discrete areas of a second metal layer overlying the dielectric layer, each of the at least two discrete areas forming an electrode of a transistor; and etching the semiconductor layer using the first and second metal layers as a mask, thereby patterning the layer of semiconductor material to form at least two transistors on the substrate.

In another aspect, this invention provides a field effect transistor comprising:

a semiconductor layer;

source and drain electrodes in electrical contact with the semiconductor layer but spaced from one another so as to leave a channel region of the semiconductor layer therebetween;

a gate dielectric layer superposed on the channel region of the semiconductor layer; and a gate electrode disposed on the opposed side of the gate dielectric layer from the channel region, such that variation of the voltage applied to the gate electrode can vary the conductivity of the channel region of the semiconductor layer, thus switching the transistor, the gate dielectric layer extending over at least portions of the source and drain electrodes adjacent the channel region, an auxiliary dielectric layer being provided between the overlapping portions of the gate dielectric layer and the source and drain electrodes, the auxiliary dielectric layer not being present in at least part of the channel region.

This transistor may hereinafter for convenience be called the "auxiliary dielectric" transistor of the invention. In such a transistor, the auxiliary dielectric layer may have a thickness at least twice as great as that of the gate electrode, and may be formed from a low k dielectric having a dielectric constant not greater than about three times the dielectric constant of free space, for example silicon dioxide, a polyimide or a screen printable dielectric. The gate electrode may be formed by printing.

The auxiliary dielectric transistor of the invention is primarily, although not exclusively, intended for use as part of a transistor array designed to drive an electro-optic display. In such a transistor array comprising at least two auxiliary dielectric transistors of the invention disposed adjacent one another, the gate dielectric may be continuous from one transistor to the other.

The present invention also provides a process (the "auxiliary dielectric" process of the invention) for forming an auxiliary dielectric transistor, this process comprising:

forming a layer of semiconductor material;

forming a layer of a conductive material superposed on the layer of semiconductor material;

forming an auxiliary dielectric layer superposed on the layer of conductive material;

patterning the auxiliary dielectric layer and the layer of conductive material, thereby forming from the layer of conductive material spaced source and drain electrodes separated by a channel region of the layer of semiconductor material, such that the auxiliary dielectric layer is removed from at least part of the channel region;

forming a gate dielectric layer overlying at least the channel region and adjacent portions of the source and drain electrodes; and forming a gate electrode superposed on the gate dielectric layer and adjacent the channel region of the semiconductor layer.

In this auxiliary dielectric process, the gate electrode may be formed by printing and the auxiliary dielectric layer may have a thickness at least twice as great as that of the gate dielectric layer.

In another aspect, this invention provides a process for producing a transistor, the process comprising:

forming a thin semiconductor layer;

printing spaced source and drain electrodes directly on to the semiconductor layer leaving a channel region of the semiconductor layer between the source and drain electrodes;

providing a gate dielectric layer superposed on the channel region of the semiconductor layer; and providing a gate electrode on the opposed side of the gate dielectric layer from the channel region of the semiconductor layer.

This process may hereinafter for convenience be called the "printed thin semiconductor layer" process of the invention. In such a process, the thin semiconductor layer may have a thickness not greater than about 50 nm, and may be formed of silicon.

In another aspect, this invention provides a backplane for an electro-optic display, the backplane comprising a plurality of pixel electrodes and a ring diode associated with each pixel electrode, each diode comprising at least one organic layer. This backplane may hereinafter for convenience be called the "ring diode" backplane of the invention. The backplane may further comprise at least one column electrode in electrical contact with a plurality of the ring diodes, the column electrode being narrower than the layer of each ring diode in immediate contact with the column electrode.

This invention extends to an electro-optic display comprising a ring diode backplane of the present invention and a layer of electro-optic medium disposed adjacent the backplane such that by varying the voltages on the pixel electrodes, the optical state of the electro-optic medium can be varied, the electro-optic medium having a threshold for switching.

This invention also provides a backplane for an electro-optic display, the backplane comprising a plurality of pixel electrodes, a diode associated with each pixel electrode, and at least one column electrode in electrical contact with a plurality of the diodes, the column electrode being narrower than the layer of each diode in immediate contact therewith.

This backplane may hereinafter for convenience be called the "narrow column electrode" backplane of the invention. In such a backplane, the layer of each diode in immediate contact with the column electrode may be organic. Alternatively, at least one diode may be a metal-insulator-metal (MIM) diode.

This invention extends to an electro-optic display comprising a narrow column electrode backplane of the present invention and a layer of electro-optic medium disposed adjacent the backplane such that by varying the voltages on the pixel electrodes, the optical state of the electro-optic medium can be varied, the electro-optic medium having a threshold for switching.

This invention also provides a backplane for an electro-optic display, the backplane comprising a column electrode, a dielectric or semiconductor layer superposed on the column electrode, an upper dielectric layer superposed on the dielectric or semiconductor layer, and a pixel electrode superposed on the upper dielectric layer, the pixel electrode extending through an aperture in the upper dielectric layer and contacting the dielectric or semiconductor layer, wherein the width of the area of contact between the pixel electrode and the dielectric or semiconductor layer is not greater than about one-fourth of the width of the column electrode.

DETAILED DESCRIPTION

Figure 9:
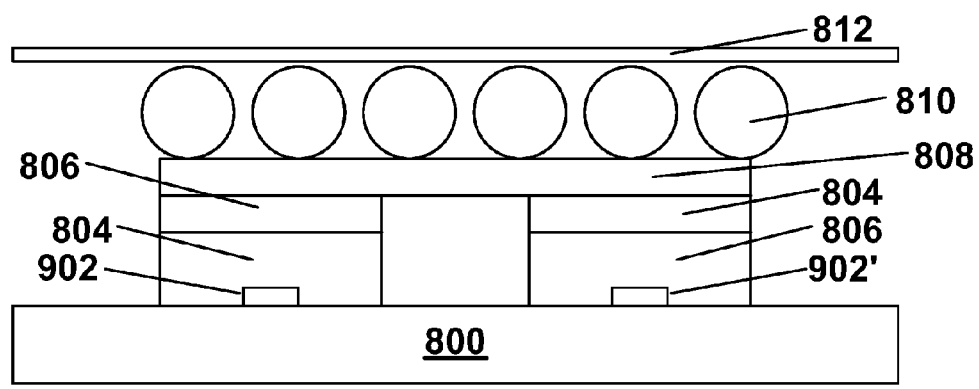
FIG. 9 is a schematic section, similar to that of FIG. 8, through a modified form of the ring diode backplane of FIG. 8, provided with a narrow column electrode.

As already indicated, this invention has several different aspects electro-optic displays and to processes and components for the production of such displays. These various aspects will mainly be described separately below, but it should be understood that a single display, process or component may make use of more than one aspect of the invention. For example, FIG. 9 illustrates a single backplane which makes use of both the ring diode backplane and the narrow column electrode backplane aspects of the invention. To take another example, a controlled moduli display of the invention may be manufactured by an internal mask process of the invention.

Controlled Modulus Display

As already mentioned, this invention provides a controlled modulus electro-optic display comprising a substrate; a plurality of non-linear devices disposed substantially in one plane on the substrate; a plurality of pixel electrodes in electrical communication with the non-linear devices; a layer of electro-optic medium; and a common electrode on the opposed side of the layer of electro-optic medium from the pixel electrodes. In this electro-optic display, the moduli of the various parts of the display are such that, when the display is curved, the neutral axis or neutral plane (i.e., the axis or plane in which no compression or tension exists) lies substantially in the plane of the non-linear devices. Desirably the neutral axis or neutral plane does not deviate from the plane of the non-linear devices by more than about 5 percent, and preferably not more than about 1 percent, of the total thickness of the display.

One preferred form of the controlled modulus display uses a so-called "buried transistor" (or more accurately, "buried non-linear device") design, in which a layer of dielectric material is interposed between the non-linear devices and the pixel electrodes, and the pixel electrodes are connected to the non-linear devices by conductive vias extending through the layer of dielectric material.

Figure 1:
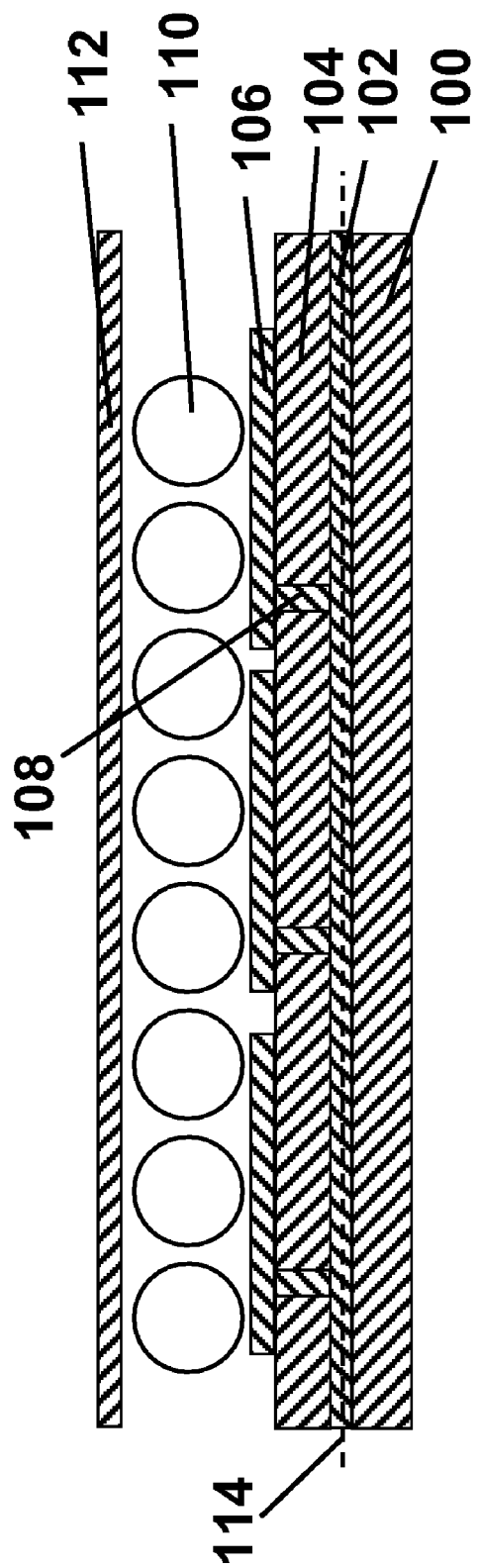
FIG. 1 of the accompanying drawings is a schematic section through a controlled moduli display of the present invention.

FIG. 1 of the accompanying drawings is a schematic section through a controlled moduli display of the present invention. The display comprises a substrate 100, which is typically formed from a metal foil, stainless steel or a polyimide being especially preferred for this purpose; a polyimide substrate will typically be about 50 μm in thickness. A thin film transistor layer 102 comprising a matrix of thin film transistors is formed on the substrate 100; in practice, as described in the aforementioned 2002/0019081, if the substrate 100 is conductive, a thin dielectric layer is applied to insulate the thin film transistors from the substrate, but this dielectric layer is not shown in FIG. 1 (the individual transistors are also not shown in FIG. 1 for ease of illustration). A layer of dielectric material 104 is disposed over the TFT layer 102; if the substrate 100 is formed of a dielectric material such as a polyimide, the dielectric layer 104 is conveniently formed of the same material. A plurality of pixel electrodes 106 are formed on the dielectric layer 104 and are connected to associated transistors (one transistor per pixel electrode) in the TFT layer 102 by conductive vias 108 extending through the dielectric layer 104. Finally, the display comprises a electro-optic layer 110 (illustrated as an encapsulated electrophoretic medium) and a front electrode 112, through which an observer views the display. In practice, the front electrode 112 is normally present as a layer of indium tin oxide or similar transparent conductive material on a front substrate, typically a polymeric film, which provides mechanical support to the front electrode 112 and acts as a protective layer for the display, but this front substrate is omitted from FIG. 1 for clarity.

The moduli of the various layers of the display are selected so that the neutral axis or neutral plane found when the display is curved lies at the position indicated by 114, passing through the TFT layer 102.

The display shown in FIG. 1 may be prepared in the following manner:

(a) Begin with a 50 μm sheet of polyimide.

(b) Fabricate the thin film transistor layer consisting of a gate metal, dielectric layer, a semiconductor layer, a contact layer and a source/drain metal layer, in the manner described in the aforementioned E Ink and MIT patents and applications;

(c) Deposit and cure or laminate a dielectric layer that is mechanically similar to the substrate material, i.e., so that the two materials substantially satisfy the relationship:

$$Y_d d_d^2 = Y_s d_s^2$$

where $Y_d$ and $d_d$ are the elastic modulus and thickness of the dielectric layer, and $Y_s$ and $d_s$ are the elastic modulus and thickness of the substrate. When this equation is satisfied, the transistors will lie in the neutral axis of the system resulting in minimal film strain. Depending on the compliance of subsequent electro-optic medium and front plane material, one can recalculate the ideal dielectric layer thickness;

(d) Pattern via holes in the dielectric layer to connect the electrode material to the transistor circuits;

(e) Deposit via and pixel electrode material to complete the circuit. Materials can be printed or ink jet or deposited using vacuum techniques. These materials should be compliant in nature and would ideally have the same mechanical properties of the substrate and dielectric material;

(f) Deposit electro-optic medium and front plane electrode, for example by lamination of a front plane laminate as described in the aforementioned 2004/0027327.

The controlled moduli display aspect of the present invention allows construction of an electro-optic display in which the transistor (or other non-linear element) layer is on the neutral axis and/or in the neutral plane, thus minimizing the tendency for cracking of the TFT or other non-linear element layers. The invention allows considerable design and material selection flexibility, and provides a high performance flexible display backplane due to the symmetrical structure surrounding the transistor or other non-linear element layer.

Internal Mask Process

As already mentioned, a second aspect of the present invention relates to an "internal mask" process for producing a plurality of non-linear devices on a substrate. This internal mask process comprises: forming an unpatterned layer of semiconductor material on the substrate; forming at least two discrete areas of metal overlying the unpatterned semiconductor layer; and etching the semiconductor layer using the discrete areas of metal as a mask, thereby patterning the layer of semiconductor material to leave at least two discrete areas of semiconductor material underlying the at least two discrete areas of metal.

The internal mask process is designed to produce cost-effective patterning of a semiconductor layer to reduce leakage between adjacent transistors in a transistor array. Obviously, all electrical circuits require that adjacent independent elements be electrically isolated from one another. For integrated circuits (i.e. circuits in which transistors are formed on a common substrate or are constructed from a common film), electrical isolation prevents undesirable leakage currents between adjacent transistors. In the case of a thin film transistor array, such as those used in active matrix backplanes, all transistors of the array are typically formed from a common semiconductor layer (film). To prevent leakage between adjacent pixels, the semiconductor is conventionally patterned using photolithography, but this patterning step represents a significant fraction of the total fabrication cost, and also introduces process complexity which makes high-volume manufacturing more difficult. To avoid this cost and complexity, the semiconductor may simply be left unpatterned, as described for example in application Ser. No. 09/565,413, filed May 5, 2000 (now U.S. Pat. No. 7,190,008). An unpatterned semiconductor necessarily to some extent increases pixel leakage, making it more difficult to maintain a charge stored on the pixel. This may have an adverse effect on the display performance, particularly for gray-scale applications.

The internal mask process of the present invention provides a process for patterning a semiconductor without requiring an additional photolithography step. This is effected by using existing circuit features, typically the electrodes of a transistor, as an etch mask for patterning the semiconductor. These existing features (i.e. patterned layers) are present in the transistor or other array independently of whether or not the semiconductor is patterned. A semiconductor present beneath such features may be patterned using the features as an etch mask.

Figure 2A:
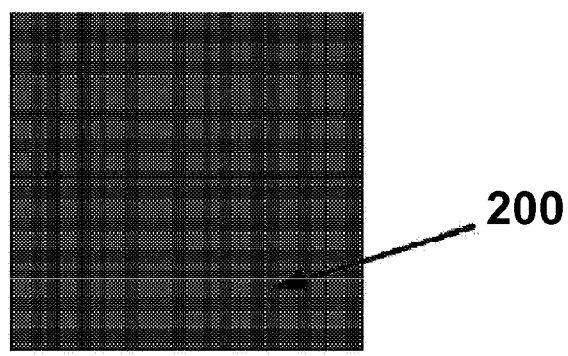
FIGS. 2A to 2D are schematic top plan views illustrating various stages of an internal mask process of the invention.
Figure 2B:
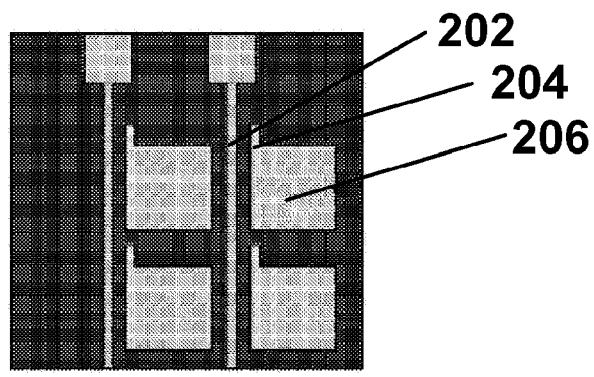
Figure 2C:
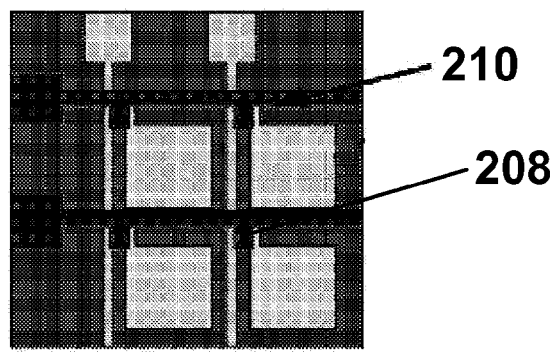
Figure 2D:
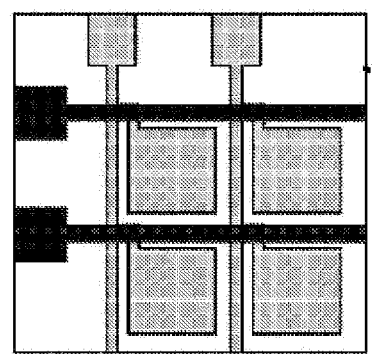

FIGS. 2A-2D of the accompanying drawings illustrate, in a highly simplified manner, one embodiment of such a process. In the first step (FIG. 2A) a uniform layer 200 of semiconductor is deposited on a substrate. Next, as shown in FIG. 2B, a conductive layer formed, for example of aluminum, a conductive polymer, or a conductive ink, is either imagewise deposited, for example by printing, or coated and patterned to form circuit features, illustrated as including column electrodes or data lines 202 (which also serve as the source electrodes of transistors, formed as described below), drain electrodes 204 and pixel electrodes 206 continuous with the drain electrodes 204; for ease of illustration FIGS. 2B-2D show the formation of only a two-by-two array of transistors although in practice of course a larger number of transistors would be formed. A gate dielectric layer is then deposited, followed by another conductive film, which is either imagewise deposited, for example by printing, or coated and patterned to form gate electrodes 208 and their associated row electrodes (select lines) 210; see FIG. 2C. The source 202, drain 204 and gate 208 electrodes, the pixel electrodes 206 and the row and column electrodes 202 and 210 can then be used as an etch mask to pattern the semiconductor without requiring an additional photolithography step. For this purpose, the semiconductor may be patterned using a plasma etch (for example, a carbon tetrafluoride etch) or a wet etch that etches the semiconductor without etching the circuit features used as a mask. The resultant patterning of the semiconductor layer reduces undesirable leakage currents between neighboring pixels, without requiring any additional photolithography steps, as would be required in a conventional process, in which the semiconductor would be patterned using photolithography between the steps shown in FIGS. 2A and 2B.

Thus, the internal mask process of the present invention allows the production of a patterned semiconductor layer which requiring only the same number of mask steps as the processes for forming unpatterned semiconductor transistor arrays described in the aforementioned application Ser. No. 09/565,413 and 2002/0106847. Thus, the internal mask process enables good performance at reduced cost and complexity, as compared to a traditional process that uses photolithography to pattern the semiconductor. Reducing the complexity of the process is an important factor in enabling high volume manufacturing.

It will be appreciated that the internal mask process of the present invention may require redesign of certain circuits to be effective. For example, the transistors formed in FIGS. 2A-2D are top gate transistors, and the gate electrodes 208 prevent removal of areas of the semiconductor layer 200 which form the channels of the transistors. If it is desired to use a bottom gate design, other circuit components may need to be repositioned to protect the channel regions of the semiconductor layer 200.

Auxiliary Dielectric Layer Transistor and Process

As already mentioned, a third aspect of this invention provides an auxiliary dielectric field effect transistor comprising:

forming the unpatterned layer of semiconductor material on the substrate; forming at least two discrete areas of a first metal layer overlying the layer of semiconductor material, each of the at least two discrete areas forming an electrode of a transistor; forming a dielectric layer overlying the first metal layer and the layer of semiconductor material; forming at least two discrete areas of a second metal layer overlying the dielectric layer, each of the at least two discrete areas forming an electrode of a transistor; and etching the semiconductor layer using the first and second metal layers as a mask, thereby patterning the layer of semiconductor material to form at least two transistors on the substrate. The present invention also provides a process for forming such an auxiliary dielectric field effect transistor.

The auxiliary dielectric field effect transistor of the present invention is designed to reduce the gate to source-drain overlap capacitance inherent in prior art transistor designs. The fabrication of an active matrix backplane typically involves patterning and registering features with critical dimensions of less than 50 μm. Photolithography is normally the only patterning technology that can meet these dimensional requirements, but photolithography is a relatively expensive process compared to other patterning technologies. Other more cost-effective patterning technologies, such as screen printing, are unable to meet the resolution/registration requirements of conventional TFT structures, and backplanes and other devices fabricated using low resolution patterning technologies usually suffer from degraded performance (such as lower drive currents) due to the long channel lengths and large parasitic source-drain/gate overlap capacitance of the resulting large transistors.

The auxiliary dielectric transistor of this invention enables high resolution patterning techniques to be replaced by low resolution patterning techniques without significantly degradation of device performance. in the auxiliary dielectric transistor, the source/drain regions and the gate can be separated by a relatively thick auxiliary (and preferably low-k) dielectric, for example, silicon dioxide, BCB, polyimide, or a screen printable dielectric.

In conventional transistors, the source/drain electrodes and the gate electrode are separated only by the gate dielectric. This imposes competing requirements on the gate dielectric, so that the final transistor design is inevitably a compromise. To provide low parasitic gate to source/drain overlap capacitance, the gate dielectric should be as thick as possible and have a low dielectric constant. However, for good device performance (as measured by parameters such as high drive current, steep sub-threshold slope, etc.), the dielectric should be thin as possible and have a high dielectric constant.

The auxiliary dielectric transistor of this invention can decouple these two competing requirements on the gate dielectric, and hence avoid the inevitable compromise present in conventional designs, by depositing the gate dielectric and the auxiliary dielectric, so that the auxiliary dielectric is not present in at least part of the channel regions of the transistors. This use of two separate dielectrics results in reduced parasitic overlap capacitance or a larger maximum permissible overlap. If a large overlap is used, a low cost, low resolution patterning or printing process may be used for the gate electrode, because the physical dimension of the gate electrode can be much greater than the critical dimension of the transistor, namely the channel length defined by the source to drain spacing. If the gate length is greater than the channel length, there will be a large region in which the gate overlaps the source and/or drain. This overlap is the source of a parasitic capacitance which can adversely affect display performance by increasing RC gate line delay and the gate-to-pixel capacitance. This invention minimizes these effects and thus allows the gate electrode to be formed using a low-resolution patterning or printing process. The auxiliary dielectric transistor of this invention also reduces the layer-to-layer registration requirements (by allowing more overlap). Low-resolution patterning processes are of course usually simpler and less costly than high resolution processes such as photolithography.

Figure 3:
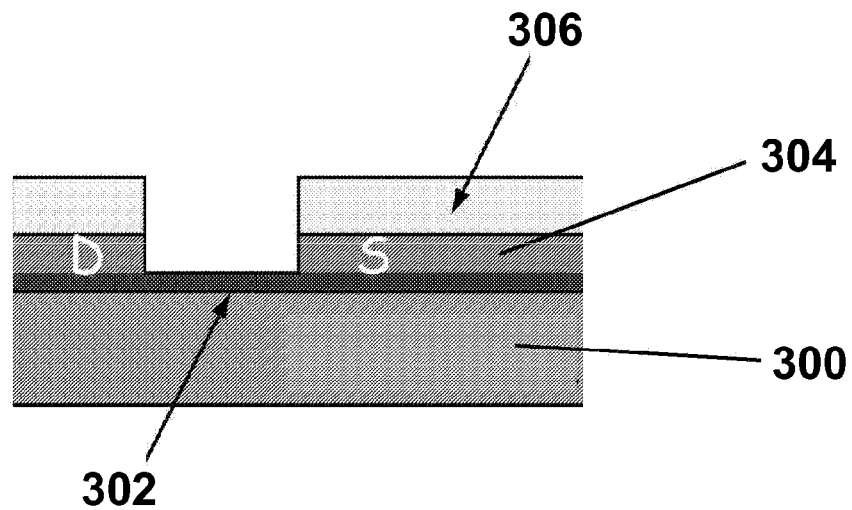
FIGS. 3 and 4 are schematic sections showing differing stages of an auxiliary dielectric process of the invention.
Figure 4:
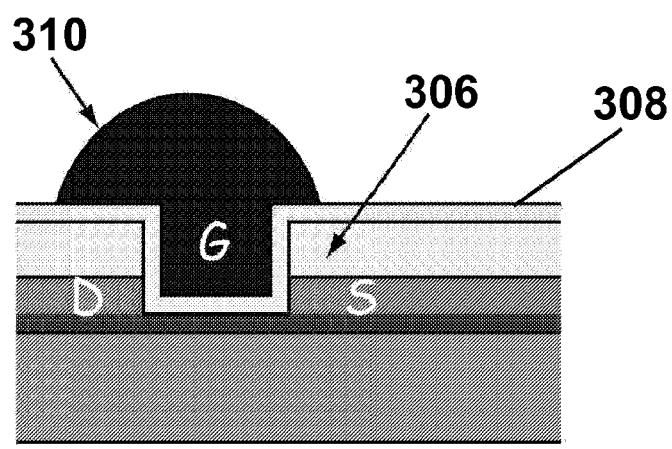
Figure 5A:
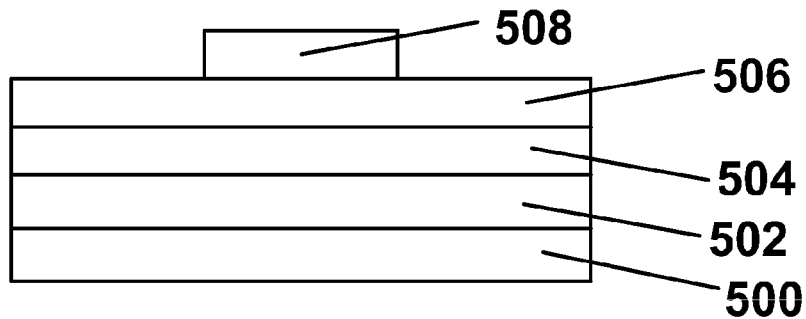
FIGS. 5A to 5D are schematic front elevations showing various stages of a prior art process for forming a thin film transistor.
Figure 5B:
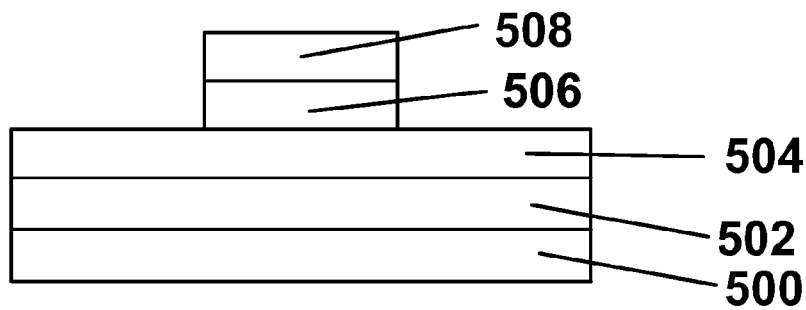
Figure 5C:
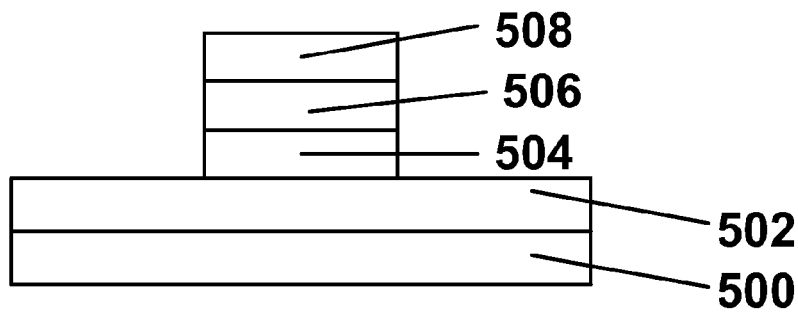
Figure 5D:
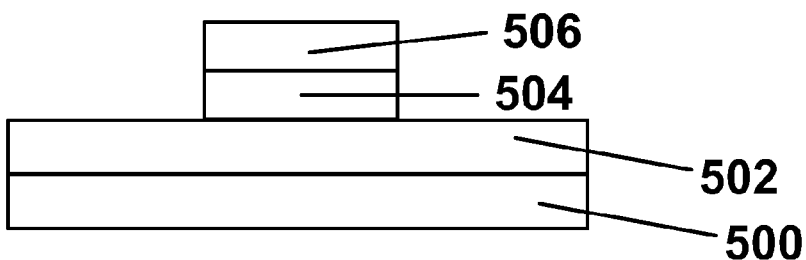

A preferred auxiliary dielectric transistor and process of the invention will now be described, though by way of illustration only, with reference to FIGS. 3 and 4 of the accompanying drawings, which are schematic sections through an auxiliary dielectric transistor at two different stages in its manufacturing process. As shown in FIG. 3, on a substrate 300 is deposited an amorphous silicon (a-Si) layer 302, a metal layer 304 and a thick low-k (auxiliary) dielectric layer 306. Photolithography is used in the conventional matter to pattern both the dielectric layer 306 and the metal layer 304, but not the a-Si layer 302, thus forming a source electrode S and a drain electrode D. Next, as shown in FIG. 4, a gate dielectric 308 is deposited over the entire substrate 300, and thereafter a gate electrode 310 is screen printed; since the overlap area between the gate 310 and the source and drain electrodes is not critical, the gate 110 can be printed or otherwise deposited using a low resolution process. It should be noted that the semiconductor 302 may be deposited at several different points in the process (namely, either before the source/drain metal layer 304 is deposited or after this metal layer has been patterned.

It should also be noted that the transistor structure shown in FIGS. 3 and 4 does not require a heavily doped semiconductor for ohmic contact between the semiconductor and source/drain metal layer. The source/drain metal layer may be directly in contact with the semiconductor. It should also be noted that only the gate dielectric 308 and not the low k dielectric 306 is present over at least part of the area of the gate electrode 310 so that in this area the gate can act on the semiconductor layer 304 through only the relatively thin gate dielectric 308, and the gate electrode 310 is not required to act through the auxiliary dielectric 306.

The auxiliary dielectric process of the present invention reduces the cost and complexity of fabricating an active matrix backplane by allowing simple, low-cost patterning techniques to replace complex, expensive techniques such as photolithography. It also reduces the layer-to-layer registration requirements. These features make the process more suitable for web-based manufacturing (compared to a traditional process using photolithography).

Printed Thin Semiconductor Process

As already mentioned, this invention provides a "printed thin semiconductor" process comprising forming a thin semiconductor layer; printing spaced source and drain electrodes directly on to the semiconductor layer leaving a channel region of the semiconductor layer between the source and drain electrodes; providing a gate dielectric layer superposed on the channel region of the semiconductor layer; and providing a gate electrode on the opposed side of the gate dielectric layer from the channel region of the semiconductor layer. This process enables the production of thin film transistors with the source and drain regions formed in a single printing step.

As indicated above, electro-optic displays require an inexpensive backplane with adequate performance. Cost analysis shows that photolithography represents a significant fraction of the total manufacturing cost for silicon-based TFT's; vacuum processing (film deposition) is another source of manufacturing cost.

Also as already discussed, to reduce patterning cost, photolithography steps may either be eliminated or replaced with a low-cost alternative. A silicon semiconductor active layer may be left unpatterned in exchange for higher pixel-to-pixel leakage. The cost of metal patterning may be reduced by replacing photolithography with a lower-cost patterning technology. Various printing technologies (screen, offset, flexogravure) are possible replacements. However, in a conventional TFT, the source/drain regions consist of highly doped silicon and a metal, both of which are patterned. The highly doped semiconductor is required for ohmic contact between the metal and semiconductor. Since doped silicon cannot be printed, "printing" the source-drain regions of such a conventional transistor in a single step is not currently possible.

The present invention relates to a process for producing transistor, in which process the use of a highly doped silicon layer is eliminated by the use of a relatively thin semiconductor layer (cf. the aforementioned 2002/0060321), and to a process for forming such a transistor by printing.

FIGS. 5A-5D, 6A-6B and 7 illustrate the simplification of the process for producing a transistor provided by the printed thin film process of the present invention. FIGS. 5A-5D illustrate the formation of source/drain regions of a transistor using a conventional process involving photolithography. In this process, there are deposited upon a substrate 500 in order, a semiconductor layer 502, a highly doped semiconductor layer 504, a metal layer 506 and a layer of photoresist 508. The photoresist layer 508 is then patterned to give the structure shown in FIG. 5A. In the next step, the metal layer 506 is etched using the photoresist 508 as a mask to give the structure shown in FIG. 5B. A second etch is then carried out using both the photoresist 508 and the patterned metal layer 506 as a mask to etch the highly doped semiconductor layer 504 and produce the structure shown in FIG. 5C. Finally, the photoresist 508 is removed to give the final source/drain region structure shown in FIG. 5D.

Figure 6A:
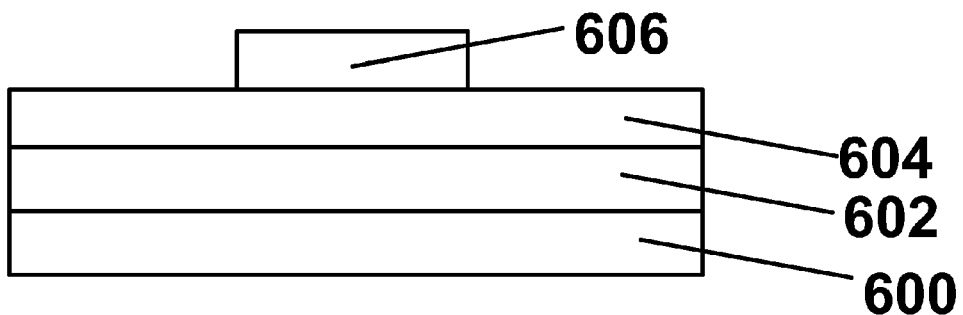
FIGS. 6A and 6B are schematic front elevations of an internal mask process of the invention.
Figure 6B:
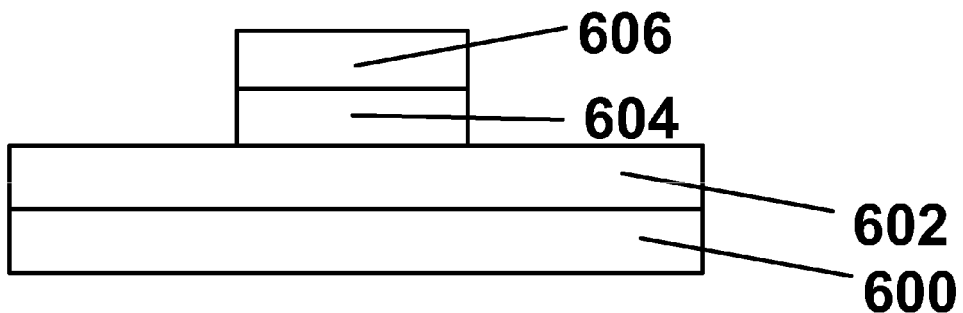

FIGS. 6A and 6B illustrate a simplified process in accordance with the internal mask process of the present invention. In the process of FIGS. 6A and 6B, there are deposited upon a substrate 600 in order, a semiconductor layer 602 and a highly doped semiconductor layer 604. A metal or other conductive layer 606 is then printed over the highly doped semiconductor layer 604 to give the structure shown in FIG. 6A. The highly doped semiconductor layer 604 is then etched using the metal layer 606 as a mask to give the final source/drain region structure shown in FIG. 6B.

Figure 7:
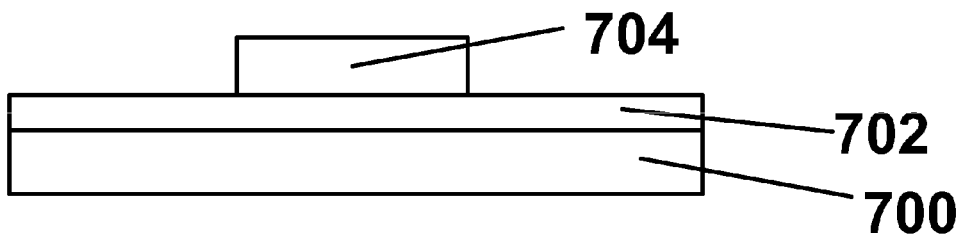
FIG. 7 is a schematic front elevation of a printed thin semiconductor process of the invention.

FIG. 7 illustrates the simplified printed thin semiconductor process of the present invention. A thin layer 702 of semiconductor, typically less than 100 nm, and desirably less than 50 nm, of silicon, is deposited upon a substrate 700. A metal or other conductive layer 704 is then printed over the semiconductor layer 702 to give the final source/drain region structure shown in FIG. 7. By using a thin semiconductor layer, a highly doped silicon contact layer is not required; this results in a simple, low-cost process.

Thus, the printed thin semiconductor process of this invention allows the source/drain regions and electrode-forming metal layer to be formed in a single, low-cost step, as opposed to a conventional process, which uses photolithography and requires multiple steps. The process reduces the cost of silicon-based active matrix backplanes, and also reduces the process complexity (compared to a traditional process), thus facilitating high-volume manufacturing.

Electro-Optic Displays with Diode Backplanes

As already mentioned, two aspects of the present invention relate to electro-optic displays with diode backplanes, namely the ring diode backplane and the narrow column electrode backplane.

It is known that backplanes for electro-optic displays can be made using diodes as the non-linear elements instead of the conventional transistors, and in principle a diode-based backplane should be less expensive than a transistor-based one. The cost savings should be especially great if a type of diode could be employed based upon soluble organic materials, since backplanes based upon such diodes could be produced using solution processing and a process conducted completely at low temperatures, in contrast to the processes used to produce transistor-based backplanes, which require vacuum processing and high temperatures. However, there are two problems hindering the adoption of diode-based backplanes. Firstly, most of the types of electro-optic displays discussed above are polarity-sensitive, so that a backplane must be capable of applying voltages of both polarities. Secondly, diodes have an inherent capacitance, and when the voltage applied to a given pixel of the display changes, the inherent capacitance causes a voltage spike which may result in undesirable changes in the state of the electro-optic medium. The present invention provides diode-based backplanes designed to reduce or eliminate the aforementioned problems.

The ring diode aspect of the present invention provides a backplane for an electro-optic display, the backplane comprising a plurality of pixels, each of which is provided with a ring diode. The ring diode conducts in either direction in forward bias, and may be formed by forming a given diode structure and the same structure in reverse.

Figure 8:
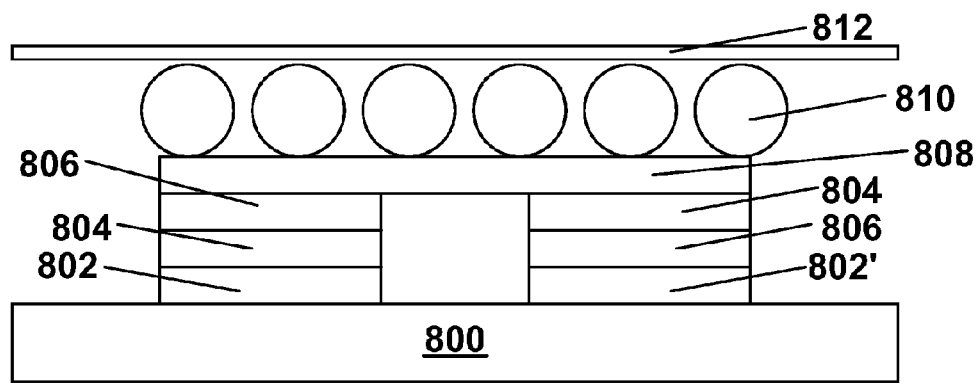
FIG. 8 is a schematic section through one ring diode and adjacent parts of a ring diode backplane of the invention.

A preferred ring diode backplane of the present invention is illustrated in FIG. 8 of the accompanying drawings, which shows a schematic side elevation of one pixel of an electro-optic display have a diode-based backplane. The electro-optic display comprises a backplane substrate 800 on which a first metal layer is deposited and patterned to form electrodes 802 and 802'. The display further comprises patterned first and second organic layers 804 and 806 which together form an organic diode; note that the layers 804 and 806 on the right-hand side of FIG. 8 are reversed as compared with those on the left-hand side in order to provide the desired ring diode structure. Finally, the display comprises a pixel electrode 808, an electro-optic medium 810 (illustrated as an encapsulated electrophoretic medium) and a front electrode 812.

The narrow column electrode backplane aspect of the present invention also relates to a backplane for an electro-optic display. The narrow column electrode backplane comprises a plurality of pixels, each of which is provided with a diode. The column electrodes associated with the diodes are of reduced width to reduce the capacitance of the diodes, and hence the voltage spikes which occur when the voltages applied to the diodes are changed. Although the limited contact area of the reduced width column electrodes reduces the available drive current, this is not normally a serious problem, since most solid electro-optic media require only small drive currents. The column electrodes are conveniently reduced to the smallest width readily available using the technique used to produce them, and typically not greater than about 25 μm.

FIG. 9 illustrates a modified version of the diode-based backplane of FIG. 8 in which the widths of the electrodes 802 and 802' have been greatly reduced to provide narrow column electrodes 902 and 902', resulting in a greatly reduced diode capacitance. The areas of the substrate covered by the organic layers 804 and 806 have been maintained constant, so that these organic layers in effect "wrap around" the narrow column electrodes 902 and 902'. It will be appreciated that these narrow column electrodes 902 and 902' could be replaced by a single column electrode centrally located between the two halves of the ring diode and having only a small contact area with the organic layers 804 and 806 thereof.

The use of narrow column electrodes is of course not confined to ring diode-based backplanes of the type illustrated in FIG. 9. For example, FIG. 10 illustrates a metal-insulator-metal (MIM) diode having a substrate 1000, a reduced width column electrode 1002, an insulator layer 1004 and a pixel electrode 1006.

Figure 10:
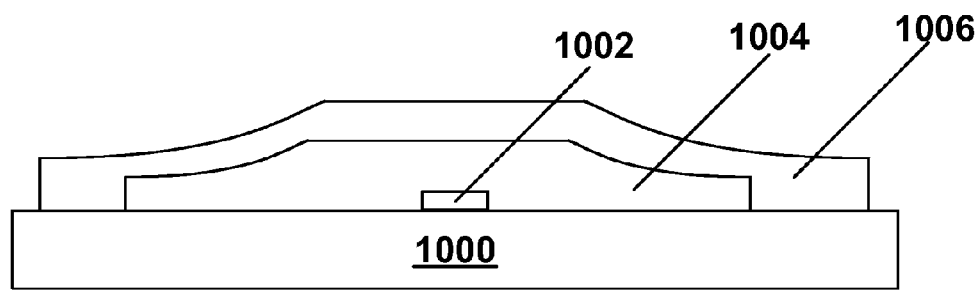
FIG. 10 is a schematic section through an MIM diode usable in a narrow column electrode backplane of the invention.
Figure 11:
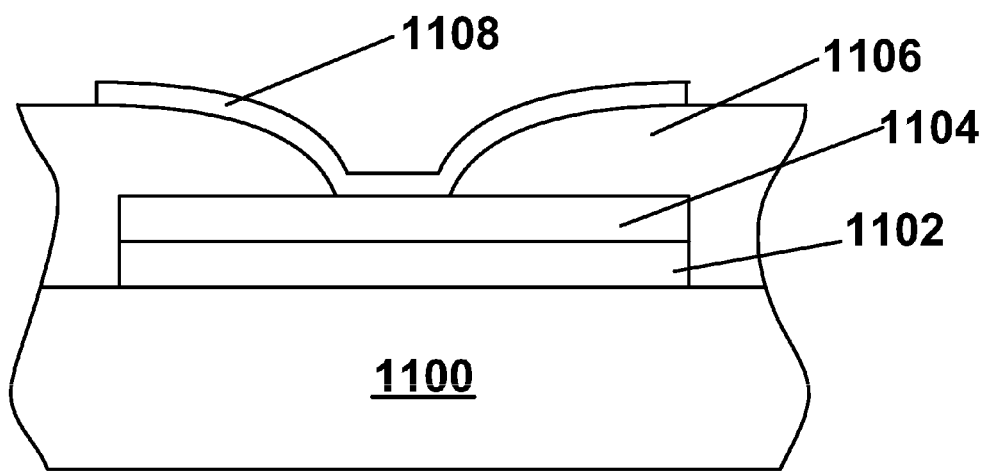
FIG. 11 is a schematic section through a second diode usable in a narrow column electrode backplane of the invention.

FIG. 11 illustrates one pixel of a diode-based backplane with reduced capacitance which is achieved in a different manner from that shown in FIGS. 9 and 10. The backplane shown in FIG. 11 comprises a substrate 1100 bearing a column electrode 1102 of conventional width. A semiconductor or insulator layer 1104 (the choice of layer 1104 of course determined by whether an MIM diode or a metal-semiconductor-metal diode is desired) having substantially the same width as the column electrode 1102 is superposed thereon. A thick dielectric layer 1106, which is desirably formed from a low k dielectric having a dielectric constant not greater than about 3, is superposed on the layer 1104. A metal pixel electrode 1108 is superposed on the dielectric layer 1106, except that a small area of the pixel electrode 1108 extends through an aperture formed in the dielectric layer 1106 and contacts the layer 1104. Thus, the area of contact between the pixel electrode 1108 and the layer 1104 is small relative to the size of the pixel electrode 1108, and the diode has a small inherent capacitance.

It will be appreciated that the pixel structure shown in FIG. 11 could be varied in several ways. For example, the size of the layer 1104 could vary, since the only part of this layer which is effective in the diode structure is that in contact with, or closely adjacent, the pixel electrode 1108. Also, it should be understood that the thickness of the dielectric layer 1106 is greatly exaggerated in FIG. 11 relative to its width; for example, in practice the dielectric layer 1106 might be 5 μm thick, while the pixel electrode might be 200 μm square, so that any "dip" in the center of the pixel electrode where it is in contact the layer 1104 would have minimal effect on the electro-optic performance of the pixel.

The width of the contact area between the pixel electrode and the layer 1104 is desirably not greater than one-fourth and desirably not greater than one-tenth of the width of the column electrode 1102. Much smaller ratios can be achieved; for example, a 200 μm wide pixel electrode, and a column electrode of the same width, with a 5 μm wide contact area between the pixel electrode and the layer 1104 would result in a 1:40 ratio.

Even with a reduced width column electrode, there will be some residual inherent capacitance in each diode, and hence there will be some voltage spike during switching. Hence, the diode-based backplanes of the present invention are most suitable for use with electro-optic media having at least a small threshold for switching. Such electro-optic medium with a threshold are known; see, for example application Ser. No. 10/711,829 (Publication No. 2005/0168799).

It will be apparent to those skilled in the art that numerous changes and modifications can be made in the specific embodiments of the present invention described above without departing from the scope of the invention. Accordingly, the whole of the foregoing description is to be construed in an illustrative and not in a limitative sense.

The invention claimed is:

1. A field effect transistor comprising:
    a semiconductor layer;
    source and drain electrodes in electrical contact with the semiconductor layer but spaced from one another so as to leave a channel region of the semiconductor layer therebetween;
    a gate dielectric layer superposed on the channel region of the semiconductor layer; and
    a gate electrode disposed on the opposed side of the gate dielectric layer from the channel region, such that variation of the voltage applied to the gate electrode can vary the conductivity of the channel region of the semiconductor layer, thus switching the transistor,
    the gate dielectric layer extending over at least portions of the source and drain electrodes adjacent the channel region, an auxiliary dielectric layer being provided between the overlapping portions of the gate dielectric layer and the source and drain electrodes, the auxiliary dielectric layer not being present in at least part of the channel region.

2. A field effect transistor according to claim 1 wherein the auxiliary dielectric layer has a thickness at least twice as great as that of the gate dielectric layer.

3. A field effect transistor according to claim 1 wherein the auxiliary dielectric layer is formed from a low k dielectric having a k value not greater than about 3.

4. A field effect transistor according to claim 1 wherein the auxiliary dielectric layer is formed from silicon dioxide, a polyimide or a screen printable dielectric.

5. A field effect transistor according to claim 1 wherein the gate electrode is formed by printing.

6. A field effect transistor array comprising at least two field effect transistors according to claim 1 disposed adjacent one another, wherein the gate dielectric is continuous from one transistor to the other.

7. An electro-optic display comprising a layer of an electro-optic medium, a front electrode disposed on one side of the layer of electro-optic medium, and a plurality of pixel electrodes disposed on the opposed side of the layer of electro-optic medium, the pixel electrodes being disposed in a plurality of rows and plurality of columns, each pixel electrode having a transistor associated therewith, the sources of all the transistors in each column being connected to a single column electrode, while the gates of all the transistors in each row are connected to a single row electrode, and wherein at least one transistor is a field effect transistor according to claim 1.

* * * * *